United States Patent
Bulja et al.

(10) Patent No.: US 11,309,729 B2
(45) Date of Patent: Apr. 19, 2022

(54) APPARATUS COMPRISING A FIRST AND SECOND LAYER OF CONDUCTIVE MATERIAL AND METHODS OF MANUFACTURING AND OPERATING SUCH APPARATUS

(71) Applicant: Nokia Solutions and Networks Oy, Espoo (FI)

(72) Inventors: Senad Bulja, Dublin (IE); Pawel Rulikowski, Dublin (IE); Anna Wielgoszewska, Dublin (IE)

(73) Assignee: Nokia Solutions and Networks Oy, Espoo (FI)

( * ) Notice: Subject to any disclaimer, the term of this patent is extended or adjusted under 35 U.S.C. 154(b) by 86 days.

(21) Appl. No.: 16/553,857

(22) Filed: Aug. 28, 2019

(65) Prior Publication Data
US 2020/0076221 A1    Mar. 5, 2020

(30) Foreign Application Priority Data
Aug. 30, 2018 (EP) .................................... 18191739

(51) Int. Cl.
*H02J 7/02* (2016.01)
*H02J 50/10* (2016.01)
*H02K 11/00* (2016.01)

(52) U.S. Cl.
CPC .............. *H02J 7/025* (2013.01); *H02J 50/10* (2016.02); *H02K 11/0094* (2013.01)

(58) Field of Classification Search
CPC ....... H02J 7/025; H02J 50/10; H02K 11/0094
USPC ......................................................... 307/108
See application file for complete search history.

(56) References Cited

U.S. PATENT DOCUMENTS

| | | | |
|---|---|---|---|
| 7,589,674 B2 | 9/2009 | Anagnostou et al. | |
| 7,965,249 B1 | 6/2011 | Wolf et al. | |
| 8,503,965 B2 | 8/2013 | Buer | |
| 9,318,531 B1 | 4/2016 | Mathur et al. | |
| 9,654,111 B1 | 5/2017 | Muchsel et al. | |
| 9,748,645 B2 | 8/2017 | Mohamadi | |
| 9,972,905 B2 | 5/2018 | Schaffner et al. | |
| 10,187,107 B1 * | 1/2019 | Bulja | H01L 45/085 |
| 10,269,735 B1 * | 4/2019 | Shukla | H03H 11/28 |
| 2011/0176351 A1 | 7/2011 | Fujitsuka et al. | |
| 2014/0054539 A1 | 2/2014 | Lu | |
| 2016/0172737 A1 | 6/2016 | Srirattana et al. | |

FOREIGN PATENT DOCUMENTS

| | | |
|---|---|---|
| WO | 2018107090 A1 | 6/2018 |
| WO | 2018107101 A1 | 6/2018 |

OTHER PUBLICATIONS

U.S. Appl. No. 62/432,345, "Reconfigurable Integrated Circuit and Operating Principle", filed Dec. 9, 2016, 47 pages, 35 sheets of drawings.

(Continued)

*Primary Examiner* — Hal Kaplan
(74) *Attorney, Agent, or Firm* — Harrington & Smith

(57) ABSTRACT

Apparatus comprising a first layer of electrically conductive material and a second layer of electrically conductive material, and a plurality of impedance elements connecting said first layer with said second layer, wherein an impedance value of at least some of said plurality of impedance elements is controllable.

17 Claims, 6 Drawing Sheets

(56) References Cited

OTHER PUBLICATIONS

U.S. Appl. No. 62/432,374, "Control System for a Reconfigurable Integrated Circuit", filed Dec. 9, 2016, 52 pages, 38 sheets of drawings.
Cetiner et al., "Multifunctional Reconfigurable Mems Integrated Antennas for Adaptive MIMO Systems", IEEE Communications Magazine, vol. 42, No. 12, Dec. 2004, 13 pages.
Haupt et al.., "Reconfigurable Antennas", IEEE Antennas and Propagation Magazine, vol. 55, No. 1, Feb. 2013, pp. 49-61.
Asghar et al., "Self-Healing in Emerging Cellular Networks: Review, Challenges and Research Directions", IEEE Communications Surveys & Tutorials, vol. 20, No. 3, 2018, pp. 1682-1709.
Frei et al., "Self-healing and Self-repairing Technologies", International Journal of Advanced Manufacturing Technology, vol. 69, 2013, 29 pages.
Golomb, "Polyominoes : Puzzles, Patterns, Problems, and Packings", Princeton University Press, 1994, 195 pages.
Lodi et al., "Two-dimensional Packing Problems: A Survey", European Journal of Operational Research, vol. 141, No. 2, Sep. 2002, pp. 241-252.
Chen et al., "Two-dimensional Packing for Irregular Shaped Objects", Proceedings of the 36th Hawaii International Conference on System Sciences, Jan. 6-9, 2003, pp. 1-10.
Kumar et al., "Fine-Grained Self-Healing Hardware for Large-Scale Autonomic Systems", Proceedings of the 14th International Workshop on Database and Expert Systems Applications, Sep. 1-5, 2003, 6 pages.
Salvador et al., "Fault Tolerance Analysis and Self-healing Strategy of Autonomous, Evolvable Hardware Systems", International Conference on Reconfigurable Computing and FPGAs, Nov. 30-Dec. 2, 2011, 6 pages.
Khalil et al., "A Cost-effective Self-healing Approach for Reliable Hardware Systems", IEEE International Symposium on Circuits and Systems (ISCAS), May 27-30, 2018, 5 pages.
Cheng et al., "A Wideband Bandpass Filter with Reconfigurable Bandwidth Based on Cross-Shaper Resonator", IEEE Microwave and Component Wireless Letters, vol. 27, No. 10, Oct. 2017, pp. 909-911.
Peik et al. "High Selectivity Reconfigurable Filters with Controlled Channel Bandwidth", IEEE MTT-S International Microwave Workshop Series on Advanced Materials and Processes for RF and THz Applications (IMWS-AMP), Sep. 20-22, 2017, 3 pages.
Simorangkir et al., "A Method to Realise Robust Flexible Electronically Tunable Antennas using Polymer-embedded Conductive Fabric", IEEE Transactions on Antennas and Propagation, vol. 66, No. 1, Jan. 2018, pp. 50-58.
Nikkhah et al., "An Electronically Tunable Biomimetic Antenna Array", IEEE Transactions on Antennas and Propagation, vol. 66, No. 3, Mar. 2018, pp. 1248-1257.
Turpin et al., "Reconfigurable and Tunable Metamaterials: A Review of the Theory and Applications", International Journal of Antennas and Propagation, 2014, pp. 1-18.
"LMS6002D", Limemicrosystems, Retrieved on Aug. 26, 2019, Webpage available at : https://limemicro.com/technology/lms6002d/.
Reck et al., "A 700-GHz MEMS Waveguide Switch", IEEE Transactions on Terahertz Science and Technology, vol. 6, No. 4, Jul. 2016, pp. 641-643.
Feng et al., "High Performance 500-750 GHz RF MEMS switch", IEEE MTT-S International Microwave Symposium (IMS), Jun. 4-9, 2017, pp. 1095-1097.
Extended European Search Report received for corresponding European Patent Application No. 18191739.4, dated Feb. 13, 2019, 7 pages.
Office action received for corresponding European Patent Application No. 18191739.4, dated Sep. 25, 2020, 5 pages.

* cited by examiner

APPARATUS COMPRISING A FIRST AND SECOND LAYER OF CONDUCTIVE MATERIAL AND METHODS OF MANUFACTURING AND OPERATING SUCH APPARATUS

CROSS-REFERENCE TO RELATED APPLICATION

This application claims the benefit of EP Application Serial No. 18191739.4, filed Aug. 30, 2018 entitled "Apparatus Comprising a First and Second Layer of Conductive Material and Methods of Manufacturing and Operating Such Apparatus", by Senad Bulja et al.

FIELD OF THE INVENTION

The disclosure relates to an apparatus comprising a first layer of electrically conductive material and a second layer of electrically conductive material. The disclosure further relates to a method of manufacturing such apparatus. The disclosure further relates to a method of operating such apparatus.

BACKGROUND

Apparatus of the aforementioned type may be used to provide components for signal processing, e.g. for processing signals in the radio frequency, RF, range.

SUMMARY

Various embodiments provide an improved apparatus of the aforementioned type which inter alia enables increased operational flexibility.

Some embodiments feature an apparatus comprising a first layer of electrically conductive material and a second layer of electrically conductive material, and a plurality of impedance elements arranged between said first layer and said second layer, said impedance elements connecting said first layer with said second layer, wherein an impedance value of at least some of said plurality of impedance elements is controllable. By controlling the impedance value of individual ones or at least some of said plurality of impedance elements, a resulting coupling between the first and second layers may be influenced, wherein this coupling inter alia depends on the spatial distribution of the impedance elements and the impedance values obtained by said control. This inter alia enables to control electromagnetic conditions (electric field and/or magnetic field), particularly local electromagnetic conditions in the region of the specific impedance element.

According to further embodiments said first layer and/or said second layer is a contiguous layer, e.g. comprising a contiguous area of electrically conductive material in a plane defined by said layer.

According to further embodiments, a substrate layer is provided between said first layer and said second layer, which enables efficient manufacturing and obtaining a defined geometry such as e.g. a distance between said first and second electrically conductive layers. Preferably, said substrate layer comprises dielectric (electrically non-conductive) material.

According to further embodiments, said plurality of impedance elements are arranged within said substrate layer, which enables a high degree of integration.

According to further embodiments, at least one impedance element of said plurality of impedance elements comprises at least one of: a switch, in particular an electrochromic switch, a variable capacitor, a diode (impedance may be controlled by applying a bias voltage). According to further embodiments, at least one impedance element of said plurality of impedance elements may also comprise a combination of two or more of the aforementioned elements (a switch, in particular an electrochromic switch, a variable capacitor, a diode).

According to further embodiments, if an impedance element comprises a switch, different impedance values such as a low resistance (i.e., comparatively low value of the real part of the impedance) or a high resistance (i.e., comparatively high value of the real part of the impedance) may be obtained by controlling the switch. In other words, in a switched-on state of the switch, a particularly low resistance may be obtained, thus connecting the first and second electrically conductive layers in the region of the specific impedance element via said low resistance, which e.g. affects the distribution of currents and/or the current density of the first and second conductive layers. By contrast, in a switched-off state of the switch, a usually comparatively high resistance is given so that substantially no strong effect is obtained with respect the distribution of currents and/or the current density of the first and second conductive layers in the region of the specific impedance element.

According to further embodiments, switches may also provide for one or more intermediate switching states, in addition to the switched-on and the switched-off state, whereby a respective resistance may be provided to connect the first and second conductive layers in the region of the specific impedance element. As an example, if a switch is designed as a MOSFET, the resistance of its drain-source path may be controlled by applying a respective voltage to the gate-source path of the MOSFET.

According to further embodiments, if an impedance element comprises a variable capacitor (e.g., a varactor), different impedance values may be obtained by controlling the variable capacitor, which affects a capacitive coupling between the first and second electrically conductive layers in the region of the specific impedance element.

According to further embodiments, if an impedance element comprises an electrochromic (EC) switch (e.g., a switch comprising electrochromic material), different impedance values for said impedance element may be obtained by controlling the EC switch, e.g. by applying one or more control voltages (and/or an optical control signal), which, in analogy to the aforementioned types of impedance elements, affects a coupling between the first and second electrically conductive layers in the region of the specific impedance element.

According to further embodiments, the apparatus and/or the impedance elements are configured to process radio frequency, RF, signals. As an example, the impedance elements may be chosen and/or configured such that they are capable of handling and/or switching signals in the RF range. This way, RF signals may be processed by the apparatus, and the plurality of degrees of freedom regarding the coupling between the first and second electrically conductive layers (both in terms of a spatial arrangement of the individual impedance elements and in terms of a degree of e.g. resistive and/or capacitive (and/or inductive) coupling as enabled by the individual impedance elements) may be used for said processing of said RF signals.

According to further embodiments, one or more of the following aspects may be considered. From a technological point of view, RF switches can be clustered in three groups:

1. Electromechanical switches, which rely on the principles of electromagnetic (EM) induction and e.g. use mechanical contacts as part of the switching mechanism, 2. Solid state switches (e.g., MOSFET (metal-oxide-semiconductor field-effect transistor)), which rely on semiconductor technology. It has no moving parts, but functions similarly as the electromechanical switch. Semiconductor diodes may also be considered as solid-state type RF switches, which may e.g. be controlled by application of a DC (direct current) bias voltage.

3. Bulk-material tuneable switches—this type of switches relies on the characteristics of the materials (substrate) to perform a switching upon being activated by an external excitation. Examples of these switches are the abovementioned electrochromic (EC) switches.

Further to this classification, according to further embodiments, RF switches can be further differentiated by their topology: 1. Single pole double throw (SPDT), 2. Multiport switches (SPnT), 3. Transfer switches, 4. Bypass switches. In addition to the abovementioned top-level classification, according to further embodiments, switches may also be differentiated by their important characteristics, such as power handling, switching time, frequency of operation, repeatability, to name but a few. The highest operational frequency of switches may be determined by their intrinsic characteristics. For semiconductor-based switches, the highest frequency of operation is determined not only by the mobility of the charge carriers, but also by the characteristics of the packaging, which, in many cases, limit the highest frequency of operation. As an example, for an RF MEMS (microelectromechanical system), due to the moving cantilever, the highest frequency of operation may be determined by the stray capacitance.

According to further embodiments, a first group of one or more impedance elements of said plurality of impedance elements is provided that comprises a first type of impedance element, and a second group of one or more impedance elements of said plurality of impedance elements is provided that comprises a second type of impedance element which is different from said first type of impedance element. This further increases operational flexibility. According to further embodiments, more than two groups with different types of impedance elements each may also be provided.

According to further embodiments, said first layer of electrically conductive material and said second layer of electrically conductive material are arranged substantially parallel (i.e., enclosing a maximum angle of 5 degrees) to each other, which may e.g. be attained by arranging said first and second layers of electrically conductive material on respective opposing (e.g. top and bottom) surfaces of a/the substrate layer.

According to further embodiments, at least some of said plurality of impedance elements are arranged in a regular raster along at least one dimension of said apparatus, wherein preferably said regular raster is characterized by a respective spacing along said at least one dimension.

According to further embodiments, at least one impedance element of said plurality of impedance elements comprises a stacked layer configuration having a plurality of functional layers, wherein said functional layers are stacked over each other along a stack coordinate, which stack coordinate is substantially parallel to a surface normal of a surface of the first layer and/or said second layer. This enables a high level of integration. According to further embodiments, however, the stack coordinate may be substantially perpendicular to a surface normal of a surface of the first layer and/or said second layer.

According to further embodiments, at least one capacitive element is connected in series to at least one impedance element of said plurality of impedance elements. Said at least one capacitive element may e.g. operate as a direct current (DC) blocking capacitor preventing an exchange of direct current signal components between parts of an impedance element and/or the first and/or second electrically conductive layer.

According to further embodiments, a plurality of control lines is provided to control a) at least one individual impedance element of said plurality of impedance elements and/or b) a group of several impedance elements of said plurality of impedance elements. This way, individual impedance elements may be individually controlled to attain a desired impedance value. Similarly, if a group of several impedance elements of said plurality of impedance elements is provided with a common control line, said several impedance elements of said group may be controlled simultaneously using said common control line.

According to further embodiments, it is e.g. possible to provide several impedance elements in a desired spatial pattern and to control said impedance elements by means of a common control line. As an example, if several impedance elements are arranged in the substrate layer in the form of a rectangle, a basically cuboid shape is defined by said rectangle and the portions of the first and second conductive layers, whereby e.g. a resonator may be defined by appropriate control of said impedance elements. E.g., when controlling said impedance elements to assume a switched-on state, enabling a low impedance coupling between the first and second layers in the region of said impedance elements, the respective portions of the cuboid shape may be controlled to assume a desired electric potential, i.e. the potential of the second conductive layer, which may e.g. correspond with a reference potential such as e.g. ground potential.

According to further embodiments, the apparatus further comprises a control device for controlling at least some impedance elements and/or groups of impedance elements of said plurality of impedance elements, wherein said control device is preferably configured to control an impedance value of at least some impedance elements and/or groups of impedance elements of said plurality of impedance elements.

According to further embodiments, the control device may be configured to apply corresponding control signals to the control lines of the impedance elements and/or groups of impedance elements (e.g., a respective drain-source voltage for impedance elements comprising a MOSFET as a switch, or a (DC) control voltage for impedance elements comprising a varactor).

Further embodiments feature a method of manufacturing an apparatus comprising a first layer of electrically conductive material and a second layer of electrically conductive material, said method comprising the following steps: providing said first layer of electrically conductive material, providing said second layer of electrically conductive material, providing a plurality of impedance elements between said first layer and said second layer, said impedance elements connecting said first layer with said second layer, wherein an impedance value of at least some of said plurality of impedance elements is controllable.

According to further embodiments, a different sequence of the aforementioned providing steps is also possible. As an example, at first, the plurality of impedance elements may be provided, which may e.g. be arranged within or embedded within a substrate layer. After this, opposing (e.g. top and bottom) surfaces of the substrate layer may be provided with the first and second electrically conductive layers.

Further embodiments feature a method of operating an apparatus comprising a first layer of electrically conductive material and a second layer of electrically conductive material, and a plurality of impedance elements arranged between said first layer and said second layer, said impedance elements connecting said first layer with said second layer, wherein an impedance value of at least some of said plurality of impedance elements is controllable, preferably an apparatus according to any of the claims 1 to 11, wherein said method of operating comprises the following steps: configuring one or more of said impedance elements, operating said apparatus, and optionally reconfiguring one or more of said impedance elements. The optional step of reconfiguring may also be performed dynamically, i.e. during an operation of the apparatus. According to further embodiments, the steps of configuring and/or reconfiguring may comprise controlling an impedance value of at least one impedance element and/or of at least one group of impedance elements of said apparatus, e.g. to have a predetermined value. According to further embodiments, the step of operating may e.g. comprise processing one or more signals, preferably RF signals, by means of said apparatus.

Further embodiments feature a device for processing radio frequency, RF, signals, wherein said device is configured to receive at least one input signal, wherein said radio device comprises at least one apparatus according to the embodiments and is configured to process said at least one input signal by means of said apparatus.

Further advantageous embodiments of said method are provided by the dependent claims.

BRIEF DESCRIPTION OF THE FIGURES

Further features, aspects and advantages of the illustrative embodiments are given in the following detailed description with reference to the drawings in which.

DESCRIPTION OF THE EMBODIMENTS

Figure 1:
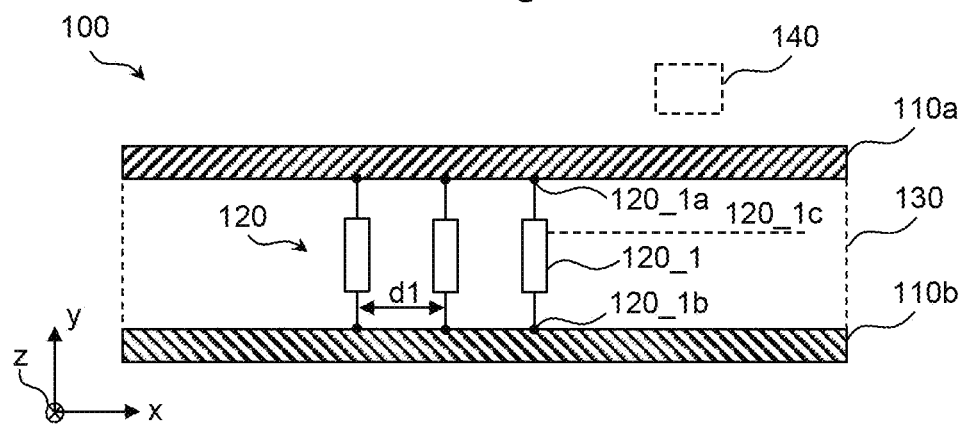
FIG. 1 schematically depicts a cross-sectional side view of an apparatus according to an embodiment, FIG. 2 schematically depicts a cross-sectional side view of an apparatus according to a further embodiment, FIG. 3 schematically depicts a top view of an apparatus according to a further embodiment, FIG. 4A schematically depicts a simplified flow-chart of a method of manufacturing an apparatus according to an embodiment, FIG. 4B schematically depicts a simplified flow-chart of a method of operating an apparatus according to an embodiment, FIG. 5 schematically depicts a cross-sectional side view of an apparatus according to a further embodiment, FIG. 6 schematically depicts a perspective view of an apparatus according to a further embodiment, FIG. 7 schematically depicts a perspective view of an apparatus according to a further embodiment, FIG. 8 schematically depicts a perspective view of an apparatus according to a further embodiment, FIG. 9A schematically depicts a top view of an apparatus according to a further embodiment, FIG. 9B schematically depicts a perspective view of the apparatus according to FIG. 9A, FIG. 10 schematically depicts a cross-sectional side view of an apparatus according to a further embodiment, FIG. 11 schematically depicts a cross-sectional side view of an apparatus according to a further embodiment, FIG. 12 schematically depicts a perspective view of an apparatus according to a further embodiment, FIG. 13A, 13B schematically depict perspective views of an electrochromic switch according to further embodiments, FIG. 14 schematically depicts a scenario according to an embodiment, and FIG. 15 schematically depicts a block diagram of a device according to further embodiments.

FIG. 1 schematically depicts a cross-sectional side view of an apparatus 100 according to an embodiment.

The apparatus 100 comprises a first layer 110$a$ of electrically conductive material and a second layer 110$b$ of electrically conductive material, and a plurality of impedance elements 120 arranged between said first layer 110$a$ and said second layer 110$b$, said impedance elements 120 connecting said first layer 110$a$ with said second layer 110$b$, wherein an impedance value of at least some of said plurality of impedance elements 120 is controllable. By controlling the impedance value of individual ones or at least some of said plurality of impedance elements 120, a resulting coupling between the first and second layers 110$a$, 110$b$ may be influenced, wherein this coupling inter alia depends on the spatial distribution of the impedance elements 120 and the impedance values obtained by said control. This enables to control electromagnetic conditions (electric field and/or magnetic field, current density), particularly local electromagnetic conditions in the region of the specific impedance element.

Exemplarily, one impedance element is denoted with reference sign 120_1. Said impedance element 120_1 comprises a first terminal 120_1$a$ which is connected in an electrically conductive manner to the first layer 110$a$ and a second terminal 120_1$b$ which is connected in an electrically conductive manner to the second layer 110$b$. An optional control line or terminal 120_1$c$ is also depicted which may be used to control the impedance value of the impedance element 120_1 according to further embodiments.

According to further embodiments said first layer 110$a$ and/or said second layer 110$b$ is a contiguous layer, e.g. comprising a contiguous area of electrically conductive material in a plane defined by said layer 110$a$, 110$b$ (said plane extending along the x axis and the z axis, which is perpendicular to the drawing plane of FIG. 1).

According to further embodiments, a substrate layer 130 is provided between said first layer 110$a$ and said second layer 110$b$, which enables efficient manufacturing and obtaining a defined geometry such as e.g. a distance (along the y-axis) between said first and second electrically conductive layers 110$a$, 110$b$. Preferably, said substrate layer 130 comprises dielectric (electrically non-conductive) material.

According to further embodiments, said plurality of impedance elements 120 are arranged within said substrate layer 130, e.g. embedded within the substrate material, which enables a high degree of integration.

According to further embodiments, at least one impedance element of said plurality of impedance elements 120 comprises at least one of: a switch, in particular an electrochromic (EC) switch, and/or a variable capacitor. According to further embodiments, at least one impedance element of said plurality of impedance elements 120 may also comprise a combination of two or more of the aforementioned elements (a switch, in particular an electrochromic switch, a variable capacitor).

According to further embodiments, if an impedance element 120_1 comprises a switch, different impedance values such as a low resistance (i.e., comparatively low value of the real part of the impedance) or a high resistance (i.e., comparatively high value of the real part of the impedance) may be obtained by controlling the switch. In other words, in a switched-on state of the switch, a particularly low resistance may be obtained, thus connecting the first and second electrically conductive layers in the region of the specific impedance element via said low resistance, which e.g. affects the distribution of currents and/or the current density of the first and second conductive layers. By contrast, in a switched-off state of the switch, a usually comparatively high resistance is given so that substantially no strong effect is obtained with respect the distribution of currents and/or the current density of the first and second conductive layers in the region of the specific impedance element.

According to further embodiments, switches may also provide for one or more intermediate switching states, in addition to the switched-on and the switched-off state, whereby a respective resistance may be provided to connect the first and second conductive layers in the region of the specific impedance element. As an example, if a switch is designed as a MOSFET, the resistance of its drain-source path may be controlled by applying a respective voltage to the gate-source path of the MOSFET.

According to further embodiments, if an impedance element 120_1 comprises a variable capacitor (e.g., a varactor), different impedance values may be obtained by controlling the variable capacitor, which affects a capacitive coupling between the first and second electrically conductive layers in the region of the specific impedance element.

Figure 13A:
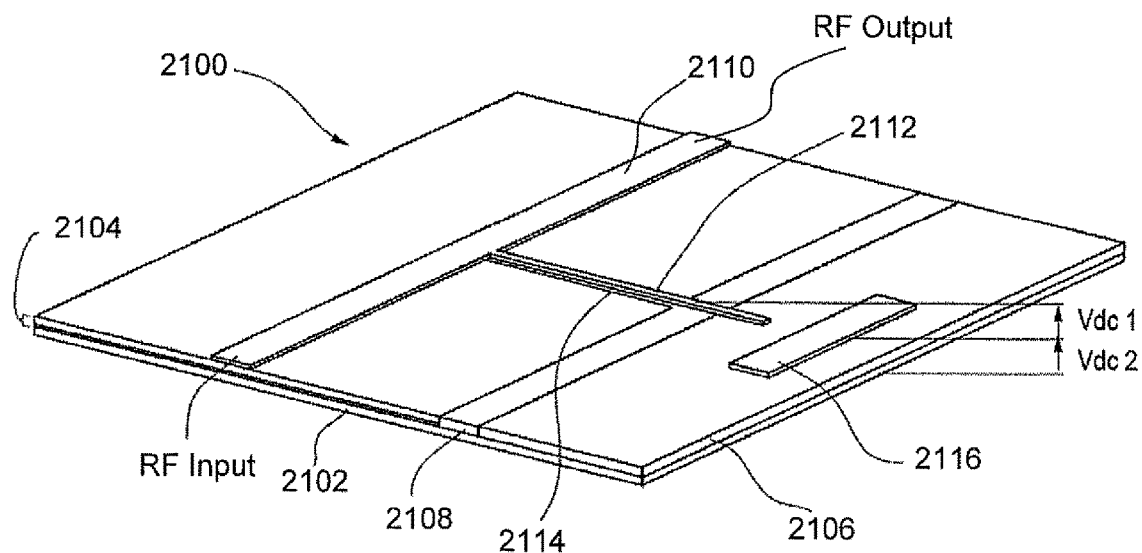

According to further embodiments, if an impedance element comprises an electrochromic (EC) switch (e.g., a switch comprising electrochromic material, for details cf. FIG. 13A, B), different impedance values for said impedance element may be obtained by controlling the EC switch, e.g. by applying one or more control voltages (and/or optical control signals), which, in analogy to the aforementioned types of impedance elements, affects a coupling between the first and second electrically conductive layers in the region of the specific impedance element. Details of further embodiments related to EC switches are explained further below with reference to FIG. 13A, 13B.

According to further embodiments, the apparatus 100 and/or the impedance elements 120 are configured to process radio frequency, RF, signals. As an example, the impedance elements 120 may be chosen and/or configured such that they are capable of handling and/or switching signals in the RF range. This way, RF signals may be processed by the apparatus, and the plurality of degrees of freedom regarding the coupling between the first and second electrically conductive layer (both in terms of a spatial arrangement of the individual impedance elements and in terms of a degree of e.g. resistive and/or capacitive (and/or inductive) coupling as enabled by the individual impedance elements) may be used for said processing of said RF signals.

According to further embodiments, one or more of the following aspects may be considered. From a technological point of view, RF switches can be clustered in three groups:

1. Electromechanical switches, which rely on the principles of electromagnetic (EM) induction and e.g. use mechanical contacts as part of the switching mechanism, 2. Solid state switches (e.g., MOSFET (metal-oxide-semiconductor field-effect transistor)), which rely on semiconductor technology. It has no moving parts, but functions similarly as the electromechanical switch.

3. Bulk-material tuneable switches—this type of switches relies on the characteristics of the materials (substrate) to perform a switching upon being activated by an external excitation. Examples of these switches are the abovementioned electrochromic (EC) switches.

Further to this classification, according to further embodiments, RF switches can be further differentiated by their topology: 1. Single pole double throw (SPDT), 2. Multiport switches (SPnT), 3. Transfer switches, 4. Bypass switches. In addition to the abovementioned top-level classification, according to further embodiments, switches may also be differentiated by their important characteristics, such as power handling, switching time, frequency of operation, repeatability, to name but a few. The highest operational frequency of switches may be determined by their intrinsic characteristics. For semiconductor-based switches, the highest frequency of operation is determined not only by the mobility of the charge carriers, but also by the characteristics of the packaging, which, in many cases, limit the highest frequency of operation. As an example, for an RF MEMS (microelectromechanical system), due to the moving cantilever, the highest frequency of operation may be determined by the stray capacitance.

Figure 2:
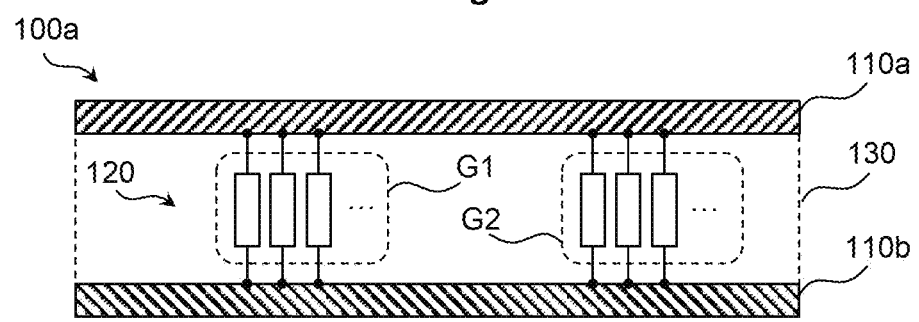

According to further embodiments, cf. the configuration 100a of FIG. 2, a first group G1 of one or more impedance elements of said plurality of impedance elements 120 is provided that comprises a first type of impedance element, and a second group G2 of one or more impedance elements of said plurality of impedance elements 120 is provided that comprises a second type of impedance element which is different from said first type of impedance element. This further increases operational flexibility. According to further embodiments, more than two groups G1, G2 with different types of impedance elements 120 each may also be provided.

According to further embodiments, said first layer 110a of electrically conductive material and said second layer 110b of electrically conductive material are arranged substantially parallel (i.e., enclosing a maximum angle of 5 degrees) to each other, which may e.g. be attained by arranging said first and second layers 110a, 110b of electrically conductive material on respective opposing (e.g. top and bottom) surfaces of the substrate layer 130.

Figure 3:
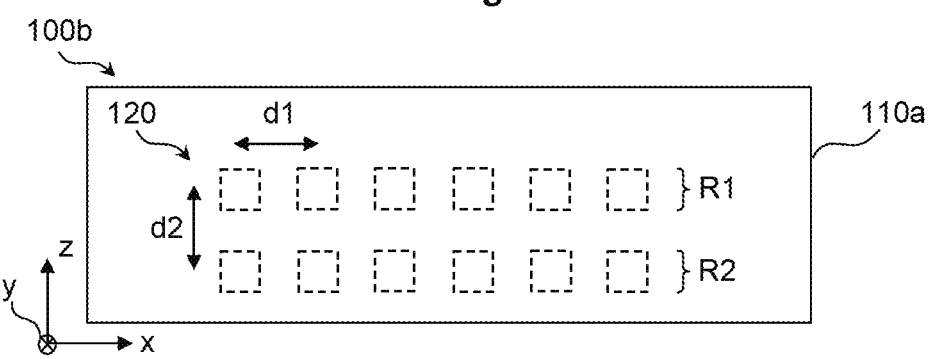

According to further embodiments, cf. the configuration 100b of FIG. 3, at least some of said plurality of impedance elements are arranged in a regular raster along at least one dimension x, z of said apparatus 100b, wherein preferably said regular raster is characterized by a respective spacing d1, d2 along said at least one dimension. Presently, as can be seen from the top view of FIG. 3, there are two "rows" R1, R2 of impedance elements 120, wherein a spacing of adjacent impedance elements 120 along the axis x is denoted by reference sign d1, and wherein a spacing of adjacent impedance elements 120 along the axis z is denoted by reference sign d2. According to further embodiments, d1 may be equal to or different from d2. According to further embodiments, non-regular spacings in at least one dimension or axis x, y are also possible.

Generally, according to further embodiments, impedance elements may arbitrarily be placed between the layers 110a, 110b, for example in all positions where a coupling between said layers 110a, 110b by means of said impedance element(s) may be desired or should be configurable in future. If such coupling will be required in future, the corresponding impedance element(s) may be activated by appropriate configuration (e.g., when using a switch, the switch may be switched on, or when using a varactor, the capacity may be increased; for this, the optional control lines may be used). Otherwise, the corresponding impedance element(s) may remain deactivated so that substantially no coupling will be effected (apart from effects due to e.g. a parasitic capacitance of the impedance element as such and/or a non-ideal open circuit resistance of a switch in its switched-off state).

Figure 4A:
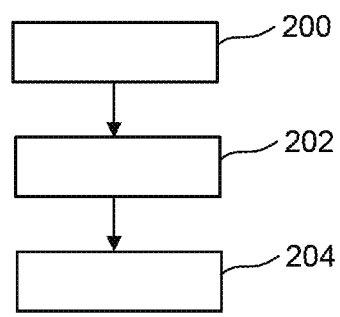

FIG. 4A schematically depicts a flow-chart of a method of manufacturing an apparatus 100 (FIG. 1) according to an embodiment. Said method comprises the following steps: providing 200 (FIG. 4A) said first layer 110a (FIG. 1) of electrically conductive material, providing 202 (FIG. 4A) said second layer 110b of electrically conductive material, providing 204 a plurality of impedance elements 120 between said first layer 110a and said second layer 110b, said impedance elements 120 connecting said first layer 110a with said second layer 110b, wherein an impedance value of at least some of said plurality of impedance elements 120 is controllable.

According to further embodiments, a different sequence of the aforementioned providing steps 200, 202, 204 is also possible. As an example, at first, the plurality of impedance elements 120 may be provided, which may e.g. be arranged within or embedded within a substrate layer 130. After this, opposing (e.g. top and bottom) surfaces of the substrate layer 130 may be provided with the first and second electrically conductive layers 110a, 110b. Other variants with other sequences of steps are also possible according to further embodiments.

Figure 4B:
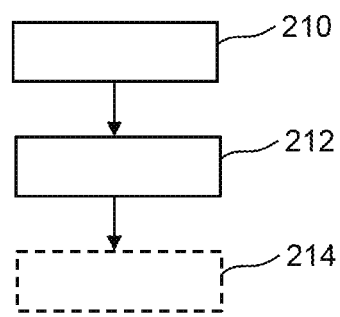

Further embodiments feature a method of operating an apparatus 100 according to the embodiments, cf. the flow-chart of FIG. 4B. Said method of operating comprises the following steps: configuring 210 one or more of said impedance elements 120, operating 212 said apparatus 100, and, optionally, reconfiguring 214 one or more of said impedance elements 120. The optional step of reconfiguring 214 may also be performed dynamically, i.e. during an operation of the apparatus 100.

According to further embodiments, the steps of configuring 210 and/or reconfiguring 214 may comprise controlling an impedance value of at least one impedance element and/or of at least one group of impedance elements of said apparatus, e.g. to have a predetermined value. Particularly, the steps of configuring 210 and/or reconfiguring 214 may be performed in the field, even dynamically (i.e., when the apparatus is operational), so that an arbitrary configuration regarding a coupling of layers 110a, 110b may be attained based on the number and type and spatial distribution of the impedance elements 120. In general, preferred embodiments may comprise a regular two-dimensional (i.e., matrix type) raster of impedance elements, for example distributed along the x-z-plane of FIG. 1 between the layers 110a, 110b, so that a wide variety of coupling variants may be established by configuration for any possible future applications.

According to further embodiments, the step of operating 212 may e.g. comprise processing one or more signals, preferably RF signals, by means of said apparatus 100.

Figure 14:
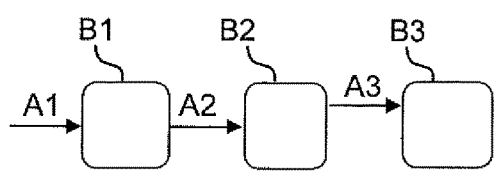
Figure 15:
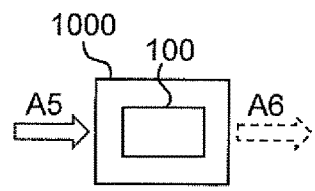

Turning to FIG. 14, an application scenario according to further preferred embodiments is illustrated. Block B1 represents a user who receives component requirements A1, e.g. depending on a desired target system 1000, cf. FIG. 15, for the apparatus 100. As an example, according to further embodiments, the target system 1000 may comprise or represent a device 1000 for processing radio frequency, RF, signals, wherein said device 1000 is configured to receive at least one input signal A5 (e.g., an RF signal in the MHz (Megahertz) or GHz (Gigahertz) range), wherein said radio device 1000 comprises at least one apparatus 100 according to the embodiments and is configured to process said at least one input signal A5 by means of said apparatus 100. Optionally, the device 1000 may output an output signal A6 based on said processing. As an example, the apparatus 100 may be configured to implement the functionality of at least one of the following elements: filter, antenna, waveguide, transmission line, resonator, and the like.

Returning to FIG. 14, the user B1 (or a calculating unit configured to perform these steps) may derive a component design A2 depending on the component requirements A1 and optionally further restrictions such as e.g. a target operating frequency range, desired filter characteristics, power handling capabilities, and the like. The component design A2 is provided to a control device B2, 140 (FIG. 1) for controlling at least some impedance elements and/or groups of impedance elements of said plurality of impedance elements 120 to implement the desired functionality as characterized by the component design A2. The control devices B2, 140 derive suitable control signals A3 for at least some impedance elements and/or groups of impedance elements of said plurality of impedance elements 120 and control the apparatus B3, 100 or its respective impedance elements 120 accordingly. Optionally, according to further embodiments, the apparatus B3, 100 or its respective impedance elements 120 may provide a feedback or status (update) information to the control device B2, 140.

According to further embodiments, the reconfigurability of the apparatus 100 according to the embodiments can be realized with a wide range of types of impedance elements such as e.g. varactors or switches, for example based on MEMS, carbon nanotubes or electrochromic (EC) materials. According to further embodiments, the impedance elements 120, e.g. switches, may be controlled via the control unit 140 (FIG. 1) (corresponding to block B2 of FIG. 14), that may send respective control signals, e.g. in the sense of actuation requests, to the apparatus 100, preferably based on the device/overall system/network requirements. As mentioned above, the control unit 140, B2 may receive the input in the form of a component design A2 from a user, which may e.g. be done manually or using computer software. According to further embodiments, the control unit 140, B2 may then verify the status of the apparatus 100, e.g. states of individual impedance elements, and may activate impedance elements, e.g. switches. According to further embodiments, based on performance parameters of the actuated impedance elements, e.g. switches, (current consumption or voltage drop, for example), the control unit 140, B2 may receive a status response, which may be used for verification of a correct/incorrect operation.

Advantageously, according to further embodiments, the configuration of the apparatus 100 (i.e., the setting of a desired impedance value for at least one controllable impedance element) can be quickly changed, for example as quickly as a settling time of switches or varactors used to implement said impedance elements 120. According to further embodiments, if switches are used to implement said impedance elements 120, a variety of switches or switch types, respectively, can be used, depending e.g. on application and required power handling capability. To name just a few: MEMS, PIN, Schottky cold MESFET (Metal-semiconductor field-effect transistor), MOSFET. The principle according to the embodiments lends itself to planar PCB (printed circuit board), LTCC (low temperature co-fired ceramics) and IC (integrated circuit) type implementation.

Figure 5:
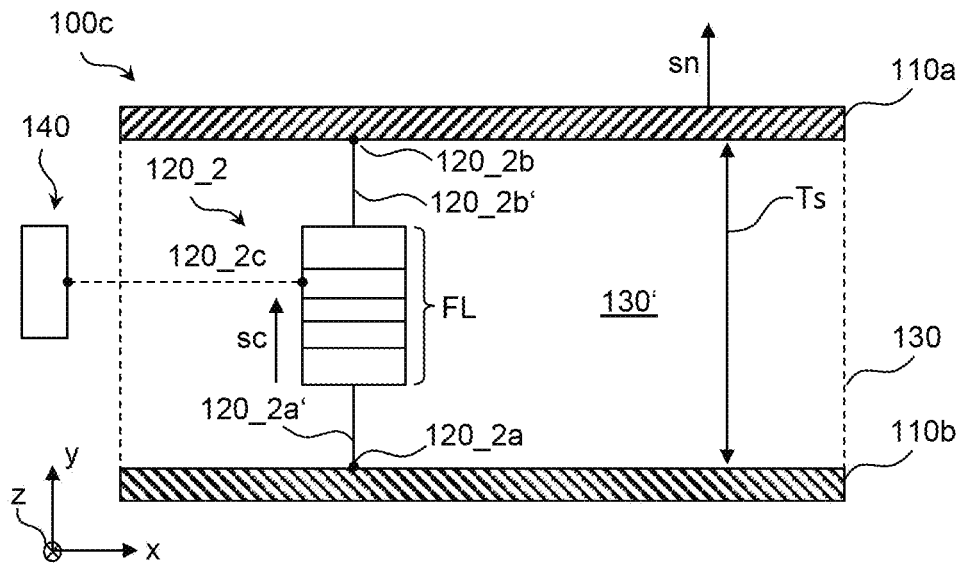

According to further embodiments, cf. the apparatus 100c depicted by FIG. 5, at least one impedance element 120_2 (e.g., a switch such as a MOSFET or an EC-type switch) of said plurality of impedance elements comprises a stacked layer configuration having a plurality of functional layers FL, wherein said functional layers FL are stacked over each other along a stack coordinate sc, which stack coordinate sc is substantially parallel to a surface normal sn of a surface of the first layer 110a and/or said second layer 110b. This enables a high level of integration. According to further embodiments, however, the stack coordinate may be substantially perpendicular to a surface normal sn of a surface of the first layer and/or said second layer, or aligned with any other direction different from the abovementioned variants.

As can be seen from FIG. 5, the functional layers FL of the switch 120_2 are connected with terminals 120_2a, 120_2b to the respective layer 110a, 110b. Optionally, vias 120_2a', 120_2b' embedded within the substrate layer material 130' may be provided between the functional layers FL and the respective layer 110a, 110b. A control line 120_2c may also be embedded in the substrate layer material 130' and enables to provide a control signal from the control unit 140 to the impedance element 120_2 to control its impedance or switching state.

According to further embodiments, a layer thickness $T_5$ of the optional substrate layer 130 may e.g. range between 10 μm (micrometer) to several millimeter (mm) (for example, similar to PCB substrates), preferably between about 100 μm to several mm.

Figure 6:
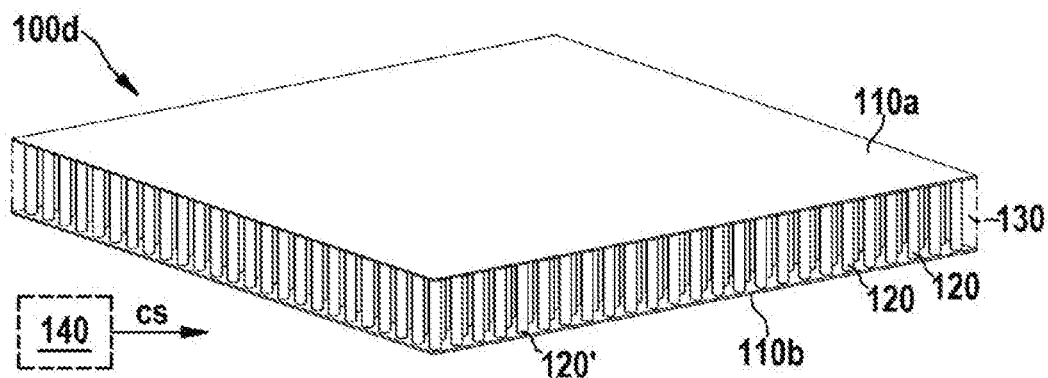

FIG. 6 schematically depicts a perspective view of an apparatus 100d according to a further embodiment. Apparatus 100d comprises a plurality of impedance elements 120 implemented in the form of switches, which are embedded in a substrate layer 130 arranged between the electrically conductive layers 110a, 110b. As can be seen from FIG. 6, the switches extend vertically through the substrate layer 130, i.e. parallel to a surface normal (FIG. 5) of the conductive layers 110a, 110b.

Advantageously, by opening or closing the switches 120 according to further embodiments, the local EM conditions may be strongly affected. As an example, when a specific switch 120' is left open, a local value of current in the region of said specific switch 120' (also including portions of the layers 110a, 110b) decreases (and associated M (magnetic)-field), but a local value of voltage increases (and associated E (electric)-field). The situation is reversed when the switch 120' is closed. Since a functionality of devices processing signals, e.g. RF signals, is dependent upon manipulation of magnetic and electric fields, the actuation of the switches 120 of the apparatus 100d changes the function of the apparatus with respect to such signals. The apparatus 100, 100a, 100b, 100c, 100d according to the embodiments can accommodate any standard RF device such as filter, antenna, phase shifter, directional coupler; just to name a few. Furthermore, several of the differing in function devices can be programmed by configuring the apparatus 100d, together with the network of their interconnects such as transmission lines or waveguides. The configuration of the apparatus 100d can also be reprogrammed on-demand ("reconfiguration") using the optional control unit 140, e.g. by providing control signals cs for individual impedance elements or groups of impedance elements.

Figure 7:
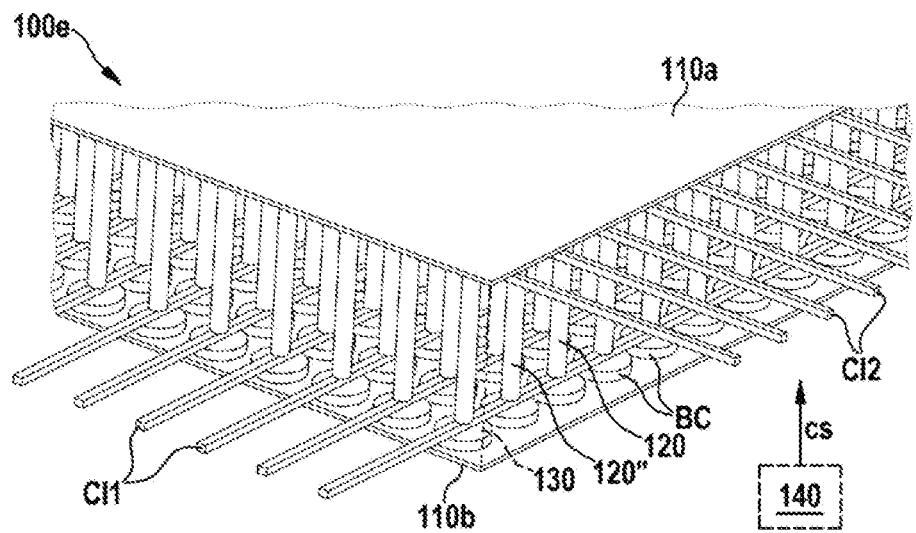

FIG. 7 schematically depicts a perspective view of an apparatus 100e according to a further embodiment, which, in contrast to the configuration 100d of FIG. 6, comprises additional direct current (DC) blocking capacitors BC connected in series with individual switches 120 preventing an exchange of direct current signal components between parts of an impedance element (switch) and/or the first and/or second electrically conductive layer 110a, 110b. Note that DC blocking capacitors may be provided at both (upper and lower) ends of the switches 120, although, for reasons of clarity, only the lower DC blocking capacitors BC are depicted by FIG. 7. To summarize, for an individual switch 120" of the apparatus 100e, a series connection as follows is provided: a portion of the first layer 110a in the region of said switch 120", a first DC blocking capacitor BC, the switch 120", a second DC blocking capacitor BC, a portion of the second layer 110b in the region of said switch 120". FIG. 7 also depicts a plurality of control lines or inputs CI1, CI2, that may be embedded in a substrate material of the substrate layer 130 (FIG. 1), which is not shown in FIG. 7. According to preferred embodiments, the control inputs CI1, CI2 enable to supply each individual switch 120" (and/or groups of switches) with a respective control signal cs, that may e.g. be provided by the optional control unit 140.

According to further embodiments, operating voltages for the switches 120 may be highly dependent on a technology used. For example, for switches based on PIN diodes, switch ON voltages are up to 1 V, but the switch ON dc current may exceed a few mA (milliampere). According to further embodiments, for switches based on MOSFET (CMOS in particular) the switch ON voltages may go up to 5 V. The switch OFF voltage in both cases is may be 0 V.

According to further embodiments, for EC-based switches, switch ON voltages can go up to 10 V, while the switch OFF voltages may be negative (around 10 V, too).

According to further embodiments, if variable impedance is used, i.e. variable capacitances using semiconductor technology, dc bias voltages can range up to10 s V, where the exact value may be determined by a breakdown voltage of the particular semiconductor technology used. According to further embodiments, for EC-based variable capacitances, the dc bias voltages are up to 10 V, whereas ferro-electric variable impedance elements may use high dc voltages, which can go up to 100 s V, depending on the thickness of active ferro-electric films (thick films require higher dc bias voltages).

In other words, according to further embodiments, the switches 120 of apparatus 100e, once actuated (i.e., activated) connect a particular point or region on the top layer 110a to the bottom layer 110b, which may be a ground plane, resulting in a disturbance of the electric current in the respective regions of the layers 110a, 110b. This, in turn, results in the re-distribution of the electric current on the first layer 110a so as to accommodate the newly introduced short to the ground plane 110b. If the apparatus or device 100e were to operate as an antenna, placing an arbitrary short at any point of its surface 110a may result in changes of its impedance and radiation characteristics.

Presently, the switches 120 of the apparatus 100e are arranged in a two-dimensional regular raster, corresponding to a matrix arrangement, comprising n many rows an m many columns, so that (n*m) many switches 120 are provided. Preferably, all n*m many switches 120 may be individually controlled by means of said control unit 140, particularly individually switched on or off independent of a state of other switches. In other words, this configuration represents a type of "canvas" on which a wide variety of RF devices can be made, e.g. by configuring the individual switches 120. According to further embodiments, instead of switches, particularly EC switches or MOSFETs, other impedance elements 120 with a controllable impedance may also be used. According to further embodiments, the switches may be considered to form a n×m matrix, enabling the "drawing" of various RF circuits. In this way, each switch 120 can be thought of as a "bit" or "pixel" on the RF canvas provided in form of said apparatus 100e. By properly actuating the "bits" or the "pixels" (i.e., the switches 120 or generally impedance elements 120), various RF components can be created, such as: antennas, antenna array, filters and waveguides. According to further embodiments, the granularity or accuracy of the devices that can be created in this way depends on a "density" of the switches and/or on their spatial distribution between the layers 110a, 110b.

Figure 8:
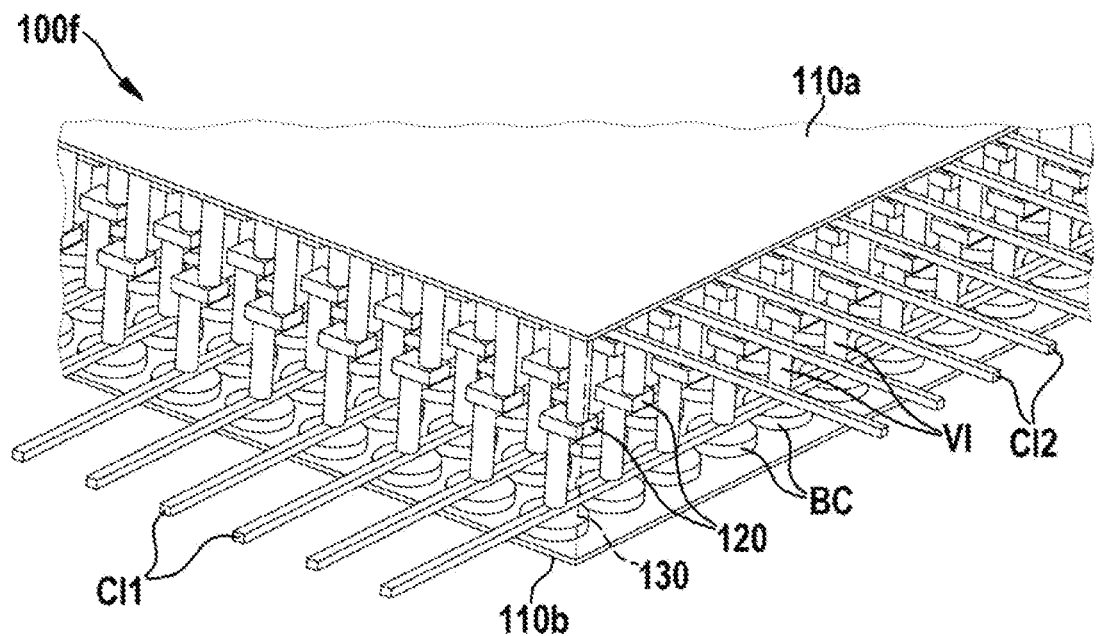

FIG. 8 schematically depicts a perspective view of an apparatus 100f according to a further embodiment. Here, the switches 120, which may e.g. be EC switches, are made on a separate layer and laid out horizontally, as opposed to the embodiment depicted in FIG. 7, which shows the switches placed vertically. The realization of FIG. 8 allows more efficient integration since each functional layer FL (FIG. 5) of the switches 120 can be deposited on top of each other, also allowing for a greater level of integration. Vias VI through the substrate layer 130 are provided to electrically connect the switches 120 with blocking capacitors BC.

According to further embodiments, a plurality of control lines CI1, CI2 (cf. FIG. 7, 8) is provided to control a) at least one individual impedance element of said plurality of impedance elements and/or b) a group of several impedance elements of said plurality of impedance elements. This way, individual impedance elements 120 may be individually controlled to attain a desired impedance value. Similarly, if a group G1, G2 (FIG. 2) of several impedance elements of said plurality of impedance elements is provided with a common control line, said several impedance elements of said group G1, G2 may be controlled simultaneously using said common control line.

According to further embodiments, it is e.g. possible to provide several impedance elements in a desired spatial pattern and to control said impedance elements by means of a common control line. As an example, if several impedance elements are arranged in the substrate layer 130 (FIG. 1) in the form of a rectangle, a basically cuboid shape is defined by said rectangle and the portions of the first and second conductive layers 110a, 110b, whereby e.g. a resonator may be defined by appropriate control of said impedance elements. E.g., when controlling said impedance elements to assume a switched-on state, enabling a low impedance coupling between the first and second layers 110a, 110b in the region of said impedance elements, the respective portions of the cuboid shape may be controlled to assume a desired electric potential, i.e. the potential of the second conductive layer, which may e.g. correspond with a reference potential such as e.g. ground potential.

According to further embodiments, as already mentioned above, the apparatus 100, 100a, 100b, 100c, 100d, 100e, 100f further comprises a control device 140 for controlling at least some impedance elements 120 and/or groups G1, G2 of impedance elements of said plurality of impedance elements 120, wherein said control device 140 is preferably configured to control an impedance value of at least some impedance elements and/or groups of impedance elements of said plurality of impedance elements 120. The control unit 140 may thus perform a configuration and/or reconfiguration of the apparatus, also cf. steps 210, 214 explained above with reference to FIG. 4B.

According to further embodiments, the control device 140 (FIG. 1) may be configured to apply corresponding control signals to the control lines 120_1c of the impedance elements 120_1 and/or groups of impedance elements (e.g., a respective drain-source voltage for impedance elements comprising a MOSFET as a switch, or a (DC) control voltage for impedance elements comprising a varactor).

Figure 9A:
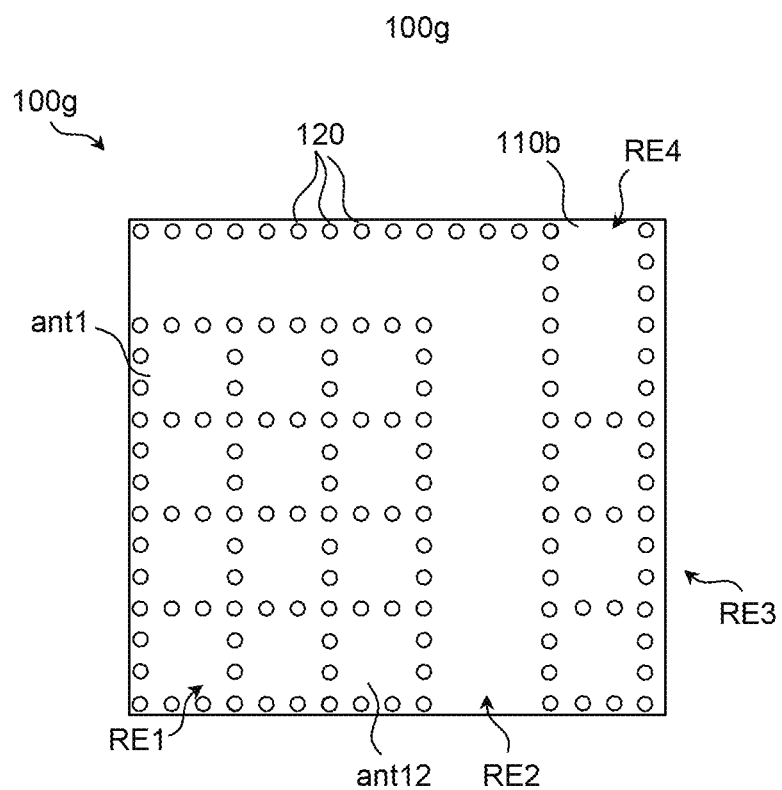
Figure 9B:
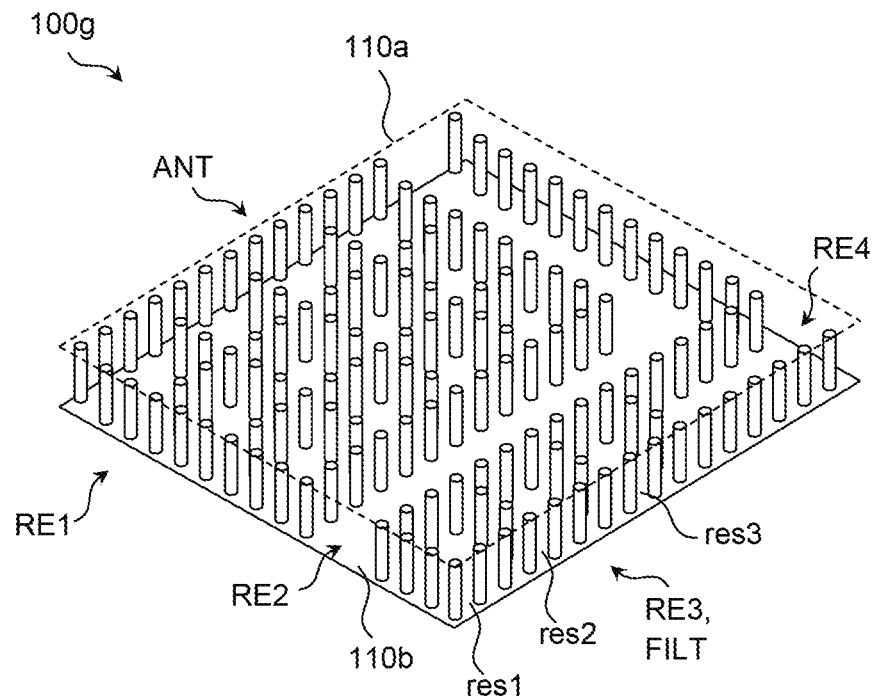

According to further embodiments, depending on the size of the apparatus 100g ("RF canvas"), cf. FIG. 9A, 9B, and the volume density of the impedance elements 120, e.g. RF switches, the apparatus 100g may support the simultaneous configuration of more than one device. FIG. 9A depicts a top view of the apparatus 100g which comprises a regular switch matrix as e.g. explained above with reference to FIG. 7, wherein the first layer 110a is not shown, and wherein switches that are not activated (i.e., in their switched-off or high-impedance state) are not shown either for the sake of clarity. It can be seen that the currently activated switches delimit various regions of the apparatus 100g thus defining a plurality of components, which may—together with the layers 110a, 110b—be used for processing of signals, e.g. of RF signals. As an example, a first region RE1 defines an antenna array comprising individual antennas ant1, . . . , ant12, also collectively denoted with reference sign ANT in FIG. 9B. A second region RE2 defines a substrate integrated waveguide (SIW), a third region RE3 defines resonators res1, res2, res3, which may operate as a three-pole filter FILT, and a fourth region RE4 defines a further antenna. If other functional elements are required, the apparatus 100g may be—even dynamically—reconfigured to activate other switches and/or deactivate currently activated switches. In other words, based on the matrix of impedance elements 120, e.g. switches, of apparatus 100g, by means of reconfiguration, required functional elements may simply be "drawn" on the RF canvas embodied by apparatus 100g. The level of reconfigurability and reusability of hardware, especially RF hardware, as proposed by the principle according to the embodiments has not been proposed, let alone presented anywhere in the literature.

Figure 10:
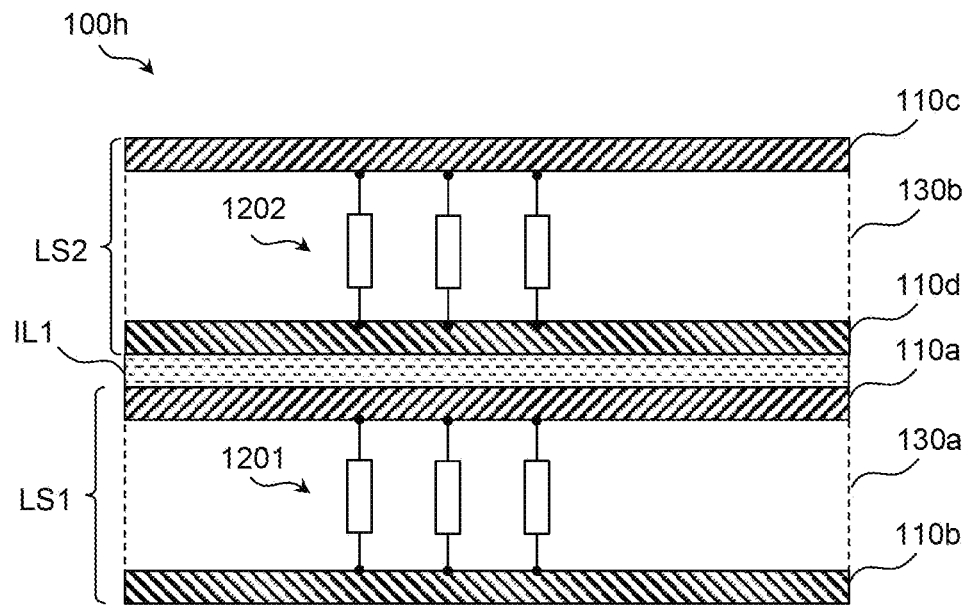

FIG. 10 schematically depicts a cross-sectional side view of an apparatus 100h according to a further embodiment. The apparatus 100h comprises a first layer system LS1 which comprises a first electrically conductive layer 110a, a second electrically conductive layer 110b, and a first dielectric substrate 130a arranged therebetween. Embedded in said first substrate 130a are a first number of impedance elements 1201. In this regard, the configuration of apparatus 100h corresponds with the configuration of apparatus 100 of FIG. 1. Additionally, the apparatus 100h of FIG. 10 comprises a second layer system LS2, which comprises a third electrically conductive layer 110c, a fourth electrically conductive layer 110d, and a second dielectric substrate 130b arranged between said layers 110c, 110d. Embedded in said second substrate 130b are a second number of impedance elements 1202. Between the layer systems LS1, LS2, an optional intermediate layer IL1 may be provided, which preferably comprises dielectric material.

Either layer system LS1, LS2 of the apparatus 100h of FIG. 10 may comprise the functionality of any apparatus 100, 100a, . . . , 100g explained above or any combination thereof. Also, according to further embodiments, the layer systems LS1, LS2 may have different numbers of impedance elements 1201, 1202 each.

According to further embodiments, more than two layer systems LS1, LS2 may be provided, also cf. FIG. 12 explained further below.

Figure 11:
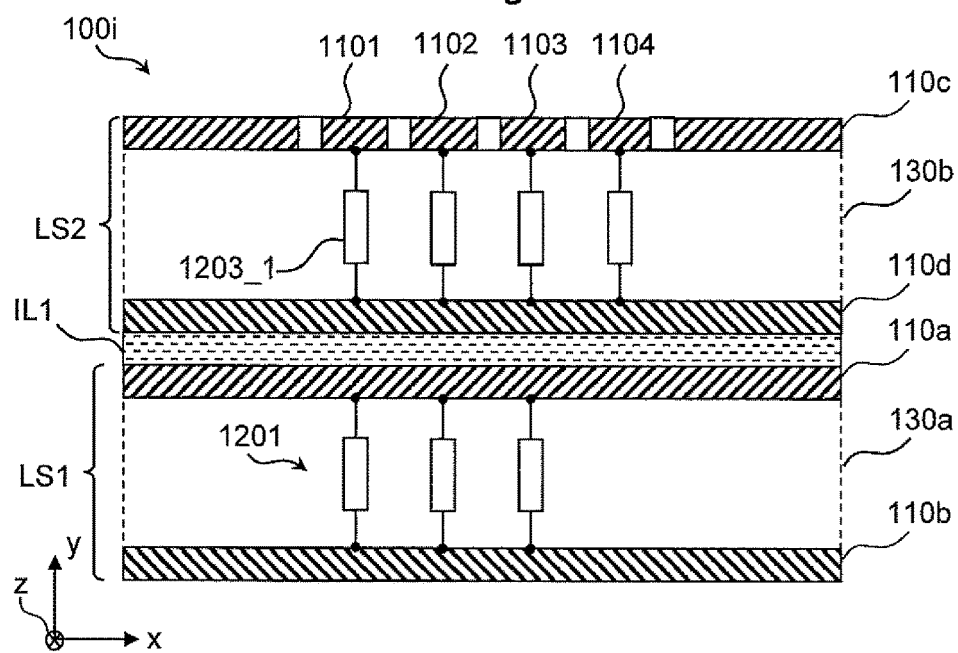

FIG. 11 schematically depicts a cross-sectional side view of an apparatus 100i according to a further embodiment, which is similar to the configuration 100h of FIG. 10. By contrast, the electrically conductive surface layer 110c, i.e. third layer 110c, is non-contiguous, but rather patched in that individual surface elements 1101, 1102, 1103, 1104 are provided that are electrically isolated from the remaining third layer 110c, but are electrically conductively connected with a respective impedance element. As an example, the first surface element 1101 is shown to be connected to the first impedance element 1203_1 of the layer stack LS2. This way, especially antennas and other radiating (and/or receiving) structures may flexibly configured by controlling the respective impedance elements via which said surface elements are coupled to the fourth layer 110d, which, according to further embodiments, may e.g. represent a ground plane. According to further embodiments, the configuration of surface elements exemplarily depicted by FIG. 11 within the third layer 110c may also be applied along a further dimension, i.e. along the z axis which is perpendicular to the drawing plane, so that a matrix-type arrangement of individual surface elements may be provided that may individually (or in groups) be connected or coupled (also capacitively, in case of e.g. varactors as impedance elements) to the fourth layer 110d. According to further embodiments, vias (not shown) between any layer of the first layer system LS1 and the second layer system LS2 are also possible, so that e.g. in the first layer system LS1 functional components such as e.g. resonators or filters may be provided by configuration of the impedance elements 1201, as explained above with reference to FIGS. 1 to 10, whereas in the second layer system LS2 preferably antenna patterns or the like may be defined by configuration. According to further embodiments, it is also possible to provide at least one further impedance element (not shown) with a controllable impedance for coupling at least two, preferably adjacent, surface elements 1101, 1102.

Figure 12:
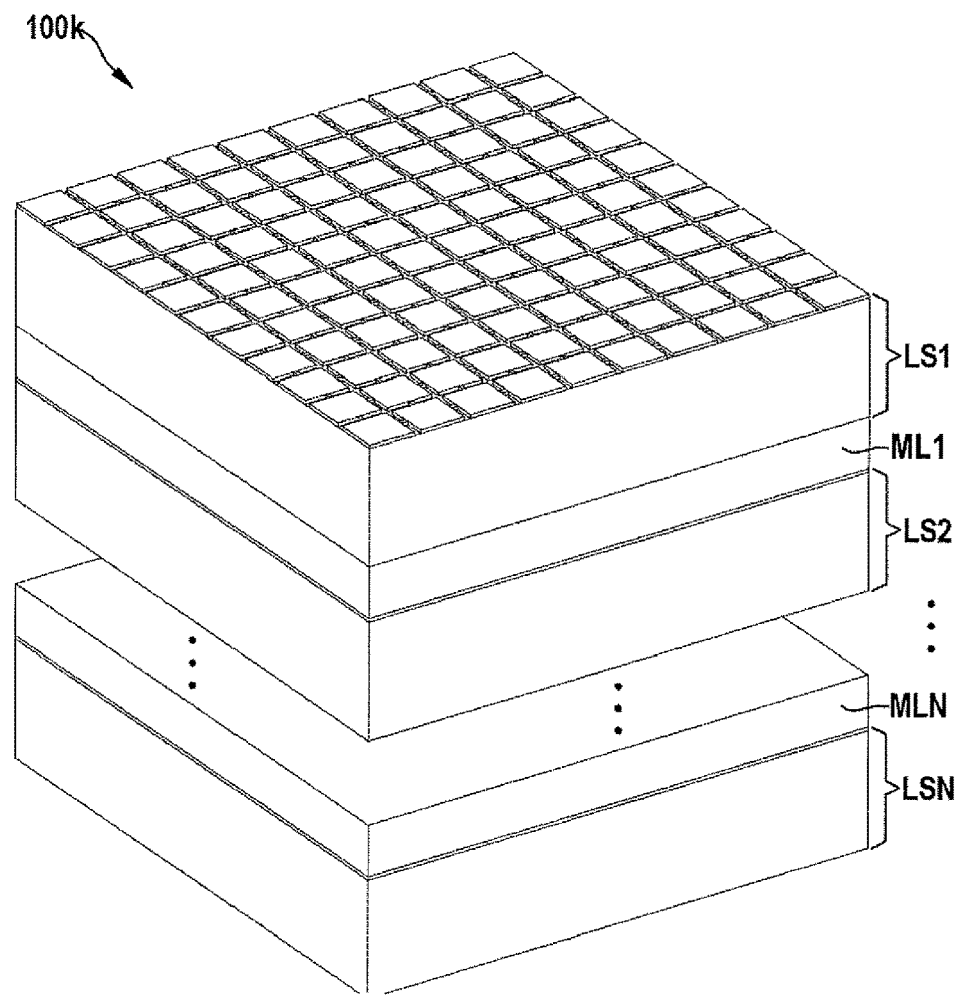

FIG. 12 schematically depicts a perspective view of an apparatus 100k according to a further embodiment, where N many layer systems LS1, LS2, . . . , LSN are arranged into a multilayer structure separated by dielectric mid-layers ML1, . . . , MLN, whereby a particularly compact configuration can be attained. According to further embodiments, the layer systems LS1, LS2, . . . can be shielded from each other by ground planes or coupled by removing the ground plane(s). Local intra-layer-system coupling by using vias is also possible according to further embodiments. Such arrangement expands also devices possibility into semi-3D applications (so called 2.5D) where currents are flowing in the Layer 1 to Layer N but they are arranged in the 3D space that couples the layers. A similar approach towards multilayering can also be applied to the embodiments explained above with respect to FIG. 1 to 11, or to combinations with any embodiment explained above with respect to FIGS. 1 to 11 with the configuration of FIG. 12.

According to further embodiments, at least one layer system of the apparatus 100k comprises two contiguous layers 110a, 110b (not shown in FIG. 12), similar to preferred embodiments based on the configuration 100 of FIG. 1. According to other examples, each layer system of the apparatus 100k comprises a patched first or top layer 110a, similar to the layer 110c of FIG. 11.

Figure 13B:
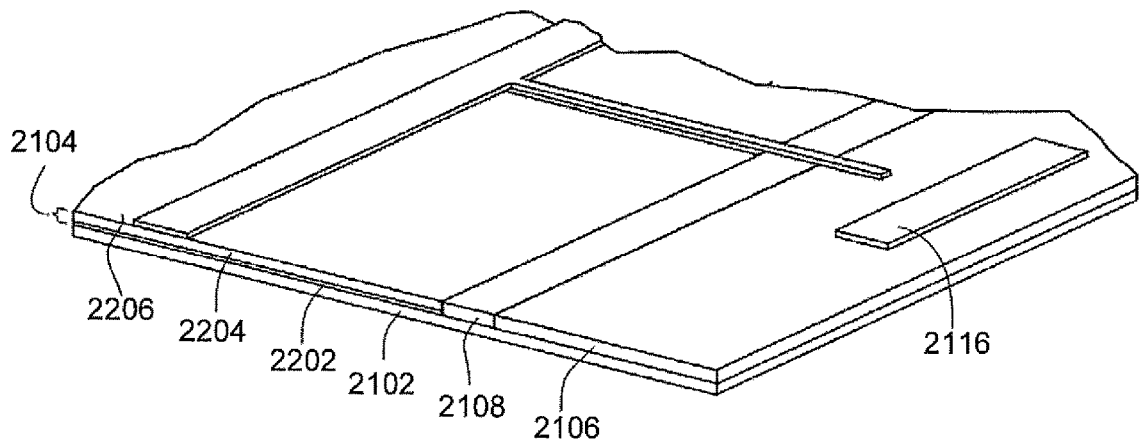

FIG. 13A, 13B schematically depict perspective views of an electrochromic (EC) switch 2100 according to further embodiments. The EC switch 2100 may e.g. be used to implement one or more impedance elements 120 as explained above, especially in the form of a Radio Frequency (RF) switch. RF switches are used in many applications for switching signals in a variety of frequency bands. One of the purposes of an RF switch, for example, is to turn a particular signal path ON or OFF. Applications using RF switches include, for example, communications systems, waveguide switches and testing systems.

Electrochromic materials are materials that allow their optical and/or electrical properties to be controlled by applying a voltage. Electrochromic materials exhibit a reversible change in optical and/or electrical properties in the presence of a voltage. An example of an electrochromic cell includes one or more electrochromic (EC) layers and an ion-containing electrolyte layer sandwiched between conducting layers. In a non-actuated state, the one or more EC layers are non-conductive and behave as insulators. The electrolyte layer is non-conductive in both actuated and non-actuated states. Upon application of a DC bias voltage between the conducting layers, ions from the electrolyte layer are expelled and subsequently injected into the one or more EC layers through a process of intercalation, which changes the fundamental characteristics of the EC layers. For certain combinations of EC and electrolyte materials, the EC layers become electrically conductive when a DC bias voltage is applied.

FIG. 13A illustrates an embodiment of an electrochromic (EC) switch 2100 for use in the apparatus according to the embodiments explained above with reference to FIG. 1 to FIG. 12, especially for RF applications. Ground plane layer 2102 acts as a substrate for EC switch 2100. Ground plane layer 2102 is formed of a conductive material, for example, gold, indium tin oxide (ITO), zinc oxide (ZnO) or a conductive polymer. Two main regions are formed on ground plane layer 2102. A first is EC region 2104 which includes at least two layers as explained in more detail in connection with FIG. 13B. A second is electrolyte region 2106. Electrolyte region 2106 serves as a tank of available ions to be injected into EC region 2104. In an embodiment, electrolyte region 2106 is formed from lithium niobate ($LiNbO_3$) but any electrolyte meeting the requirement of displaying different ion and electron conductivities, approximately $\sigma_I > 10^{-7}$ S/cm for ions and $\sigma_E < 10^{-10}$ S/cm (siemens per centimeter) for electrons may be used. EC region 2104 and electrolyte region 2106 are separated by a dielectric spacer 2108. In an embodiment, dielectric spacer 2108 is silicon dioxide ($SiO2$), but any DC bias voltage inactive material may be used.

Microstrip line 2110 transmits RF signals from one side of switch 2100 to the other and is mounted on EC region 2104. Although FIG. 13A shows microstrip line 2110 as having an RF Input and an RF Output for the purposes of illustration, either end may be used for input or output as needed. DC bias line 2112 connects microstrip line 2110 to electrolyte region 2106. In an embodiment, DC bias line 2112 may be mounted on an DC bias voltage inactive substrate 2114 similar to or the same as dielectric spacer 2108, so as to avoid diffusion of Li ions from DC bias line 2112 into EC region 2104 before they reach microstrip line 2110. Conductive pad 2116 is formed on electrolyte region 2106. In an embodiment, microstrip line 2110, DC bias line 2112 and conductive pad 2116 are formed from a conductive material, for example, gold, silver, copper, or indium tin oxide (ITO). Similarly, according to further embodiments, the conductive layers 110a, 110b, 110c, 110d of the apparatus 100, . . . , 100k according to the embodiments explained above with reference to FIGS. 1 to 15 may be formed from a conductive material, for example, gold, silver, copper, or indium tin oxide.

A magnified view of a portion of FIG. 13A is shown in FIG. 13B. Like reference numerals designate like parts in both figures. In an embodiment, EC region 2104 is shown to include three layers, a first chromic layer 2202, an optional conductive layer 2204 and a second chromic layer 2206. In an example embodiment, chromic layers 2202 and 2206 are transition metal oxides, for example, tungsten oxide ($WO_3$) and nickel oxide (NiO) respectively. In other representative embodiments, chromic layer 202 may be formed from, for example, titanium oxide ($TiO_2$), molybdenum trioxide ($MoO_3$), tantalum oxide ($Ta_2O_5$) or niobium pentoxide ($Nb_2O_5$) while chromic layer 206 may be formed from, for example, chromium oxide ($Cr_2O_3$), manganese oxide ($MnO_2$), iron oxide ($FeO_2$), cobalt oxide ($CoO_2$), rhodium oxide ($RhO_2$) or iridium oxide ($IrO_2$). Conductive layer 2204 is optional and is used to adjust operational characteristics of switch 2100 as will be explained in more detail below. It may be formed from, for example, indium tin oxide, although almost any conductive material may be used.

In operation, an RF signal enters microstrip line 2110 on one side of switch 2100 and exits on the other side as shown in FIG. 13A. In the absence of any DC bias voltage $V_{dc1}$, $V_{dc2}$, microstrip line 2110 behaves as a simple transmission line.

Two DC bias voltages as shown in FIG. 13A may be used in the operation of EC switch 2100. A first bias voltage $V_{dc1}$ is applied between conductive pad 2116 and ground plane 2102 in order to set Li ions in electrolyte region 2106 in motion. For the purposes of describing exemplary embodiments, electrolyte region 2106 will be described as lithium niobate ($LiNbO_3$) with Li ions, but one of ordinary skill in the art would understand that the description is applicable to any electrolyte meeting the conditions described above. The value of $V_{dc1}$ depends on the thickness of the electrolyte layer 2106 but is generally less than 10 V.

Once in motion, these ions, upon application of a second bias voltage $V_{dc2}$ between conductive pad 2116 and DC bias line 2112, move through DC bias line 2112 into RF microstrip line 2110, where they are injected into chromic layers 2202 and 2206 (FIG. 13B). In an embodiment, $V_{dc2}$ is generally less than 10 V. The application of $V_{dc2}$ causes intercalation of Li ions into chromic layers 2202 and 2206 so that they become conductive, which short-circuits microstrip line 2110 with ground plane layer 2102 through conductor 2204, if present. Short circuiting microstrip line 2110 prevents transmission of an RF signal along microstrip line 2110. Reversing the polarity of the DC bias voltages results in deintercalation. In other words, Li atoms move out of chromic layers 2202 and 2206, through DC bias line 2112 and back to electrolyte region 106 so that microstrip line 2110 again behaves as a transmission line. As shown in FIGS. 13A and 13B, bias line 2112 is a single line. In alternative embodiments, bias line 2112 may take other forms, for example, a line loaded with capacitors or an RF choke, for example.

An EC switch 2100 as described above has several technical advantages including tailoring of the switching characteristics for different applications. For example, switching speed may be increased by either adjusting the thickness of the chromic layers or by increasing the size of the conductive pad exposed to electrolyte region.

In an embodiment, the thicknesses of chromic layers 2202 and 2206 of EC region 2104 are approximately 50-500 nm (nanometer), however, the thickness of these layers can be varied to suit particular switching applications and device size requirements. The thickness of optional conductive layer 2204, as is the case of the chromic layers, may also be varied to suit particular switching applications and device size requirements. In an embodiment, conductive layer 2204 is less than 5 microns (μm, micrometer) thick. In some embodiments, such as when it is desirable to decrease the overall thickness of EC region 2104, conductive layer 2204 may be eliminated. Alternatively, the overall thickness of EC region 2104 may be varied by increasing the thickness of conductive layer 2204, so that, for example, it is compatible with the rest of any external circuitry. In alternative embodiments, for example, where device switching speed is less important, the overall thickness of EC region 2104 can be increased by increasing the thickness of chromic layers 2202 and 2206 instead.

The thickness of chromic layers 2202 and 2206 depends on desired operating characteristics. Chromic layers 2202 and 2206 change their character upon the intercalation of ions when a DC bias voltage is applied and therefore, the thicker these layers are, the greater number of ions needed to initiate their transition from dielectrics to conductors. This in turn may require a larger source of ions in the form of the electrolyte region 2106 which increases the size of the device and possibly impacts its speed.

Additional performance characteristics of the EC switch 2100 may be tuned by adjusting the thickness of chromic layer 2202. In an embodiment, chromic layer 202 is formed of tungsten oxide ($WO_3$) which, when intercalated upon application of a DC bias voltage, is a relatively poor conductor, having a typical resistivity value of about $3 \times 10^{-3}$ ($\Omega \cdot cm$). In some embodiments, using a thin $WO_3$ layer, for example, less than 100 nm, for chromic layer 2202 together with a conductive layer 2204 may be advantageous, since the conduction is vertical with respect to ground plane 2102. In that case, the lower conductivity of chromic layer 2202 does not have a deleterious effect on the performance of the entire layered structure.

Chromic layer 2206 may be of a similar height as chromic layer 2202. Chromic layer 2206 serves the purpose of performing DC bias polarization sensitivity which allows switch 2100 to be switched ON and OFF. When switch 2100 is ON, microstrip line 2110 is short circuited and no signal is transmitted. In the absence of chromic layer 206, switch 2100 would be able to be switched ON, however, it may not be capable of being switched OFF, since, regardless of the polarization of the DC bias supply, ions from electrolyte region 2106 would flow into chromic layer 2202 unimpeded. In the case of positive DC bias supply, ions would flow into the chromic layer 2202 from the top electrode (microstrip line 2110) and in the case of a negative DC bias voltage, the ions would flow into chromic layer 2202 from the bottom electrode (ground plane 2102).

In an embodiment, the thickness of electrolyte region 2106 may be equal to the sum of the chromic layers 2202 and 2206 and optional conductive layer 2204 while providing a surface area large enough to contain enough ions needed to induce a dielectric-conductor transition of chromic layers 2202 and 2206.

Further adjustments of the switching characteristics of EC switch 2100 including the dynamic range, for example, may also be adjusted. The dynamic range of a switch is understood as the ratio between its ON and OFF states. To determine dynamic range, insertion loss is measured while the switch is in the OFF state. Ideally, this is as low as possible; however, it is influenced by the dielectric parameters of the entire substrate of the switch. Next, the insertion loss once the switch is turned ON is measured. Ideally, the insertion loss should be as high as possible. The difference between the two insertion losses is the dynamic range. The dynamic range of EC switch 2100 may be adjusted by changing the thicknesses of the chromic layers and the sandwiched conductor, if present. In addition, power handling may be determined by the overall thickness of EC region 2104. In an embodiment, when EC region 2104 is thicker it may handle higher power signals due to reduced energy density in the substrate. As with the dynamic range, power handling also can be adjusted by varying the thicknesses of the EC layers and the sandwiched conductor, if present.

The parameters indicated above are by no means exhaustive, since other parameters, such as frequency of operation, may be similarly adjusted. For example, for devices operating at lower frequencies, an embodiment of the EC switch may have a thicker EC region 2104, due to unwanted stray capacitances. In an alternative embodiment, devices operating at higher frequencies would use a thinner EC region 2104 for the EC switch. The thicknesses of devices operating at RF frequencies, including μ-wave and mm-wave frequencies, may be measured in terms of their corresponding wavelength, thus ensuring that they have the same "electrical" thickness. However, RF devices may also be measured in standard measurement units such as millimeter or inches. At low frequencies, wavelengths are big, indicating that such devices are, from the standard point of view, thicker. Thus, different embodiments can be provided without affecting other parameters by changing height of conductive layer 2204.

Another parameter which may be adjusted is the speed of the EC switch 2100. This parameter is dependent on the number of available Li ions i.e., the size of electrolyte region 2106 and the height of chromic layers 2202 and 2206. In general, the lower the height of chromic layers 2202 and 2206 and the greater the tank of Li ions, the greater is the speed of the EC switch.

The EC switch as explained above with reference to FIG. 13A, 13B may, according to further embodiments, advantageously be used to form at least one impedance element 120 of the apparatus 100, 100a, . . . , 100k. As an example, the RF Input section of the switch 2100 may be connected to the first conductive layer 110a (FIG. 1), and the RF output section of the switch 2100 may be connected to the second conductive layer 110b of e.g. the apparatus 100.

According to further embodiments, one or more of the bias voltages Vdc1, Vdc2 may be provided to switch 2100 by means of the control lines 120_1c (FIG. 1), CI1, CI2 (FIG. 7, 8). According to further embodiments, one or more of the impedance elements 120 of the apparatus 100f of FIG. 8 may be implemented in form of the EC switch 2100 of FIG. 13A, 13B.

According to further embodiments, the EC switch of FIG. 13A may be formed using a multi-layered substrate. As an example, with respect to FIG. 1, the substrate 130 may form the multi-layered substrate of the EC switch 2100 of FIG. 13A. To be more specific and in order to take into account dc biasing, according to further embodiments, one or more switches 120 of e.g. FIG. 7 may be replaced with the EC switch 2100 of FIG. 13A, while keeping the DC bias capacitors so as not to unintentionally bias the switches that were supposed to be switched off.

According to further embodiments, when using EC-type switches, the switches may be controlled, i.e. biased using light, instead of a bias voltage. As an example, a control signal for an optically controllable EC switch according to further embodiments may be provided by an (integrated) light source (e.g., broad light spectrum-LED or semiconductor laser). Preferably, said light source may be embedded or positioned in the same plane as the EC layer stack of the EC switch 2100.

The principle according to the embodiments enables a design of devices 1000 (FIG. 15), especially RF devices (e.g., devices processing RF signals), that enables their unlimited tunability and therefore allows to build fully reconfigurable RF components. It enables faster development of new components as well as high adaptability of the existing ones. This can make whole systems and networks fully adaptable e.g. to constantly changing environment conditions. By using the principle according to the embodiments, agile products and whole cognitive systems may be provided. In addition to enabling fully configurable hardware (by control of the impedance of the impedance elements), the principle according to the embodiments also increases robustness and resilience to failure of the apparatus. If for any reason an activated RF device (defined by correspondingly controlled impedance elements) fails, another one can be formed by activating another set of switches, e.g. by reconfiguration. According to preferred embodiments, electrochromic switches, e.g. as explained above with reference to FIG. 13A, 13B, may be used to form one or more impedance elements 120.

The description and drawings merely illustrate the principles of exemplary embodiments. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of exemplary embodiments and the concepts contributed by the inventor(s) to furthering the art, and are to be construed as being without limitation to such specifically recited examples and conditions. Moreover, all statements herein reciting principles, aspects, and embodiments, as well as specific examples thereof, are intended to encompass equivalents thereof.

It should be appreciated by those skilled in the art that any block diagrams herein represent conceptual views of illustrative circuitry embodying exemplary embodiments. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

A person of skill in the art would readily recognize that steps of various above-described methods can be performed and/or controlled by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

The invention claimed is:

1. An apparatus for processing signals in the radio frequency range, comprising a first layer of electrically conductive material and a second layer of electrically conductive material, and a plurality of impedance elements arranged between said first layer and said second layer, at least some of the impedance elements from said plurality of impedance elements connect said first layer with said second layer, wherein an impedance value of at least some of the impedance elements from said plurality of impedance elements is controllable;

wherein a plurality of control lines is configured to control at least one individual impedance element of said plurality of impedance elements and/or a group of several impedance elements of said plurality of impedance elements.

2. The apparatus according to claim 1, wherein said first layer and/or said second layer is a contiguous layer comprising a contiguous area of electrically conductive material.

3. The apparatus according to claim 1, wherein a substrate layer is between said first layer and said second layer, and wherein said plurality of impedance elements are arranged within said substrate layer.

4. The apparatus according to claim 1, wherein at least one impedance element of said plurality of impedance elements comprises at least one of: a switch or a variable capacitor.

5. The apparatus according to claim 4, wherein said switch is an electrochromic switch.

6. The apparatus according to claim 1, wherein a first group of one or more impedance elements of said plurality of impedance elements comprises a first type of impedance element, and a second group of one or more impedance elements of said plurality of impedance elements comprises a second type of impedance element which is different from said first type of impedance element.

7. The apparatus according to claim 1, wherein said first layer of electrically conductive material and said second layer of electrically conductive material are arranged substantially parallel to each other.

8. The apparatus according to claim 1, wherein at least some of the impedance elements from said plurality of impedance elements are arranged in a regular raster along at least one dimension of said apparatus.

9. The apparatus according to claim 8, wherein said regular raster is characterized by a respective spacing along said at least one dimension (x, z).

10. The apparatus according to claim 1, wherein at least one impedance element of said plurality of impedance elements comprises a stacked layer configuration having a plurality of functional layers, wherein said functional layers are stacked over each other along a stack coordinate, which stack coordinate is substantially parallel to a surface normal of a surface of the first layer and/or said second layer.

11. The apparatus according to claim 1, wherein at least one capacitive element is connected in series to at least one impedance element of said plurality of impedance elements.

12. The apparatus according to claim 1, further comprising a control device for controlling at least some impedance elements and/or groups (G1, G2) of impedance elements of said plurality of impedance elements, wherein said control device is configured to control an impedance value of at least some impedance elements and/or groups of impedance elements of said plurality of impedance elements.

13. A method of manufacturing an apparatus for processing signals in the radio frequency, RF, range, comprising: a first layer of electrically conductive material and a second layer of electrically conductive material, said method comprising the following: providing said first layer of electrically conductive material, providing said second layer of electrically conductive material, providing a plurality of impedance elements between said first layer and said second layer, said impedance elements connecting said first layer with said second layer, wherein an impedance value of at least some of said plurality of impedance elements is controllable; and providing a plurality of control lines configured to control at least one individual impedance element of said plurality of impedance elements and/or a group of several impedance elements of said plurality of impedance elements.

14. A method of operating an apparatus for processing signals in the radio frequency range, the method comprising:

configuring a plurality of impedance elements arranged between a first layer of electrically conductive material and a second layer of electrically conductive material; and processing one or more radio frequency signals through the plurality of impedance elements;

wherein an impedance value of at least some of the impedance elements from the plurality of impedance elements is controllable;

wherein a plurality of control lines is configured to control at least one individual impedance element of said plurality of impedance elements and/or a group of several impedance elements of said plurality of impedance elements.

15. The method of claim 14, further comprising reconfiguring one or more of the impedance elements.

16. The method of claim 14, wherein configuring one or more impedance elements comprises controlling at least one of an impedance value of at least one impedance element or at least one group of impedance elements.

17. The method of claim 16, wherein controlling at least one of an impedance value of at least one impedance element or at least one group of impedance elements comprises controlling to a predetermined value.

* * * * *